United States Patent [19]

Takeuchi et al.

[11] Patent Number: 4,458,172
[45] Date of Patent: Jul. 3, 1984

[54] ULTRASONIC PROBE

[75] Inventors: Hiroshi Takeuchi, Matsudo; Yukio Ito, Sayama; Etsuji Yamamoto, Hachioji; Shigeru Jyomura, Tokyo; Sakichi Ashida, Fuchu, all of Japan

[73] Assignee: Hitachi, Ltd., Tokyo, Japan

[21] Appl. No.: 406,015

[22] Filed: Aug. 6, 1982

[51] Int. Cl.³ ....................... G10K 11/36; H01L 41/18
[52] U.S. Cl. .................... 310/334; 310/358; 252/62.9
[58] Field of Search ............... 252/62.9; 310/334, 358; 361/233; 29/25.35

[56] References Cited

U.S. PATENT DOCUMENTS 4,243,541 1/1981 Takeuchi et al. ................... 252/62.9
4,321,155 3/1982 Yamashita et al. ................. 252/62.9

FOREIGN PATENT DOCUMENTS 54-142597 11/1979 Japan .................. 252/62.9

Primary Examiner—Jack Cooper
Attorney, Agent, or Firm—Antonelli, Terry & Wands

[57] ABSTRACT

An ultrasonic probe includes a resonator made of a piezoelectric ceramic material which is obtained by subjecting a ceramic composition containing 44.7 to 46.3 mol % of PbO, 50.9 to 51.7 mol % of $TiO_2$, 1.8 to 2.7 mol % of $Sm_2O_3$ and 0.5 to 1.0 mol % of $MnO_2$ to poling treatment in such a manner that the ceramic composition is applied with an electric field of 60 to 80 kV/cm at a temperature of 130° to 160° C.

3 Claims, 9 Drawing Figures w/t=1.0 { (PRIOR ART)
(PRESENT INVENTION)

w/t=1.5 { (PRIOR ART)
(PRESENT INVENTION)

w/t = 2.0

(PRIOR ART)

(PRESENT INVENTION)

w/t = 3.0

(PRIOR ART)

(PRESENT INVENTION)

ULTRASONIC PROBE

BACKGROUND OF THE INVENTION

The present invention relates to an ultrasonic probe, and more particularly to an ultrasonic probe made of PbTiO$_3$ piezoelectric ceramics.

PbZr$_{1-x}$Ti$_x$O$_3$ piezoelectric ceramics (hereinafter referred to a "PZT" piezoelectric ceramics") have hitherto been used to form an ultrasonic probe for sonar or medical instrumentation. The PZT piezoelectric ceramics have a property that they are large in electromechanical coupling factor representative of the efficiency of transduction between electrical and mechanical quantities, and are therefore used to form not only various transducers but also a probe for use in an electronic scan ultrasound tomographic equipment. This equipment is classified into two types, that is, a linear scanner type and a sector scanner type. In either type, a probe having such a structure as shown in FIG. 1 is used in which a number of small, rectangular strip resonators made of a piezoelectric ceramic material are arranged to form a one-dimensional array. In FIG. 1, reference numeral 11 designates a piezoelectric ceramic plate subjected to poling treatment in the direction perpendicular to the main surfaces of the plate, 12 electrodes, 13 a common electrode, 14 lead wires, and 15 a backing material. Since such a probe utilizes the thickness dilatational vibration of individual resonators, the center frequency of this vibration is fundamentally determined only by the thickness t of the resonators. However, PZT piezoelectric ceramics and other piezoelectric ceramics generally have a large electromechanical coupling factor not only in thickness dilatational vibration but also in lateral vibration, and therefore actual vibration in each of the resonators is in a coupled mode. Accordingly, when a ratio w/t of the lateral width w of each resonator to the thickness t thereof is made large, the probe is greatly affected by the lateral vibration, and therefore the pulse response characteristic of the probe is deteriorated. For this reason, the practical value of the ratio w/t has an upper limit. (For the PZT piezoelectric ceramics, the practical value of the ratio w/t is smaller than 0.8.)

On the other hand, diagnostic equipments which make viscera diagnosis by the use of ultrasonic waves having frequencies on the order of 2 to 3 MHz, have been developed, and recently it has been required to make high the resolution of the above equipments thereby enhancing the diagnostic ability thereof. Accordingly, it is important to make high the frequency at which the ultrasonic probe is operated. In order to make high the operating frequency of the probe, it is necessary to make small the thickness t of each resonator. As mentioned previously, the value of the ratio w/t has an upper limit. Accordingly, in order to make high the operating frequency of the probe, the lateral width w of each resonator must be made very narrow. However, when a probe having the form of an array is fabricated by a cutting operation, it is impossible to form resonators having a width less than a certain value. That is, it is difficult to make high the operating frequency of an array-shaped probe made of PZT ceramics.

Accordingly, it is indispensable to use a material which produces vibration substantially identical with the thickness dilatational vibration even when the value of the ratio w/t is relatively large, that is, a material having a small electromechanical coupling factor k$_p$ with respect to the lateral vibration. PbTiO$_3$ ceramics are considered to satisfy the above requirement, and therefore attention has been paid thereto recently. However, in ordinary PbTiO$_3$ ceramics, a ratio k$_t$/k$_p$ of an electromechanical coupling factor k$_t$ of thickness dilatational vibration to an electromechanical coupling factor k$_p$ of lateral vibration is on the order of 6 to 10 at most, that is, the coupling between the thickness dilatational vibration and lateral vibration is not weak. For example, when the value of the ratio w/t is made nearly equal to 1 so that the coupling between the two vibrations is strongest, the waveform of pulse response obtained by the probe cannot be put to practical use. Further, even when the value of the ratio w/t is set for a range from 1.5 to 3, the waveform of pulse response is not wholly satisfactory.

SUMMARY OF THE INVENTION

An object of the present invention is to provide an ultrasonic probe having an excellent pulse response characteristic.

Another object of the present invention is to provide an ultrasonic probe which can be put to practical use not only when a ratio w/t is set for a range from 1.5 to 3 but also when the ratio w/t is made nearly equal to 1.

In order to attain the above object, an ultrasonic probe according to the present invention is made of a piezoelectric ceramic composition containing 44.7 to 46.3 mol% of PbO, 50.9 to 51.7 mol% of TiO$_2$, 1.8 to 2.6 mol% of Sm$_2$O$_3$ and 0.5 to 1.0 mol% of MnO$_2$, or a piezoelectric ceramic composition containing 45.3 to 47.4 mol% of PbO, 47.9 to 51.0 mol% of TiO$_2$, 1.8 to 2.7 mol% of Sm$_2$O$_3$, 0.3 to 1.6 mol% of In$_2$O$_3$ and 0.5 to 1.0 mol% of MnO$_2$.

While the above-mentioned piezoelectric ceramic compositions have been disclosed in a Japanese Patent Application Laid-Open No. 142597/1979, the present invention is based upon the discovery that, when these piezoelectric ceramic compositions are subjected to an electric field of 60 to 80 KV/cm at a temperature of 130° to 160° C. for a poling treatment, piezoelectric ceramic having a large electromechanical coupling factor k$_t$ and a very small electromechanical coupling factor k$_p$ are obtained. An ultrasonic probe made of these piezoelectric ceramics is far superior in waveform of pulse response to an ultrasonic probe made of the conventional PbTiO$_3$ ceramics.

DESCRIPTION OF THE PREFERRED EMBODIMENTS

Figure 1:
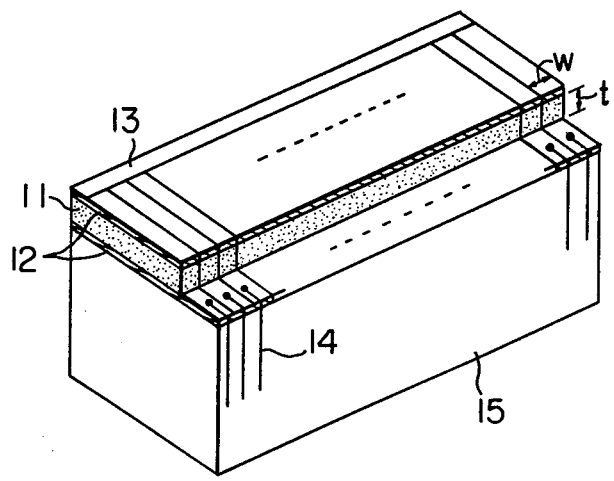
FIG. 1 is a perspective view showing the structure of an ultrasonic probe.

Each of powdery raw materials whose composition is shown in the following Table I was mixed with distilled water in a pot mill for about one hour.

TABLE I

| Sample number | Composition | Electro-mechanical coupling factor $k_t$ (%) | Electro-mechanical coupling factor $k_p$ (%) | $K_t/k_p$ |
|---|---|---|---|---|
| 1 | 46.9 PbO<br>50.6 TiO$_2$<br>1.5 Sm$_2$O$_3$<br>1.0 MnO$_2$ | 47.5 | 6.2 | 7.7 |
| 2 | 46.3 PbO<br>50.9 TiO$_2$<br>1.8 Sm$_2$O$_3$<br>1.0 MnO$_2$ | 47.5 | 4.6 | 10.3 |
| 3 | 45.8 PbO<br>51.1 TiO$_2$<br>2.1 Sm$_2$O$_3$<br>1.0 MnO$_2$ | 49.6 | 2.4 | 20.7 |
| 4 | 45.8 PbO<br>51.6 TiO$_2$<br>2.1 Sm$_2$O$_3$<br>0.5 MnO$_2$ | 49.3 | 2.6 | 18.9 |
| 5 | 45.3 PbO<br>51.4 TiO$_2$<br>2.3 Sm$_2$O$_3$<br>1.0 MnO$_2$ | 50.0 | 3.1 | 16.1 |
| 6 | 44.7 PbO<br>51.7 TiO$_2$<br>2.6 Sm$_2$O$_3$<br>1.0 MnO$_2$ | 49.6 | 3.7 | 13.4 |
| 7 | 44.2 PbO<br>51.9 TiO$_2$<br>2.9 Sm$_2$O$_3$<br>1.0 MnO$_2$ | 48.5 | 4.9 | 9.8 |
| 8 | 47.7 PbO<br>49.5 TiO$_2$<br>1.5 Sm$_2$O$_3$<br>0.8 In$_2$O$_3$<br>0.5 MnO$_2$ | 48.5 | 5.3 | 9.1 |
| 9 | 47.4 PbO<br>48.8 TiO$_2$<br>1.8 Sm$_2$O$_3$<br>1.0 In$_2$O$_3$<br>1.0 MnO$_2$ | 48.9 | 4.0 | 12.2 |
| 10 | 47.4 PbO<br>47.9 TiO$_2$<br>2.1 Sm$_2$O$_3$<br>1.6 In$_2$O$_3$<br>1.0 MnO$_2$ | 50.1 | 2.4 | 20.9 |
| 11 | 46.9 PbO<br>49.0 TiO$_2$<br>2.1 Sm$_2$O$_3$<br>1.0 In$_2$O$_3$<br>1.0 MnO$_2$ | 52.9 | 2.2 | 24.0 |
| 12 | 46.9 PbO<br>49.5 TiO$_2$<br>2.1 Sm$_2$O$_3$<br>1.0 In$_2$O$_3$<br>0.5 MnO$_2$ | 53.1 | 2.4 | 22.1 |
| 13 | 46.4 PbO<br>50.0 TiO$_2$<br>2.1 Sm$_2$O$_3$<br>0.5 In$_2$O$_3$<br>1.0 MnO$_2$ | 51.7 | 2.3 | 22.5 |
| 14 | 46.4 PbO<br>50.2 TiO$_2$<br>2.1 Sm$_2$O$_3$<br>0.3 In$_2$O$_3$<br>1.0 MnO$_2$ | 52.0 | 2.5 | 20.8 |
| 15 | 46.4 PbO<br>50.3 TiO$_2$<br>2.1 Sm$_2$O$_3$<br>0.2 In$_2$O$_3$<br>1.0 MnO$_2$ | 49.9 | 2.6 | 19.2 |
| 16 | 47.4 PbO<br>47.8 TiO$_2$<br>2.1 Sm$_2$O$_3$<br>1.7 In$_2$O$_3$<br>1.0 MnO$_2$ | 49.2 | 2.7 | 18.2 |
| 17 | 46.5 PbO<br>49.1 TiO$_2$<br>2.4 Sm$_2$O$_3$<br>1.0 In$_2$O$_3$<br>1.0 MnO$_2$ | 53.2 | 2.4 | 22.2 |
| 18 | 45.8 PbO<br>49.6 TiO$_2$<br>2.6 Sm$_2$O$_3$<br>1.0 In$_2$O$_3$<br>1.0 MnO$_2$ | 53.0 | 2.8 | 18.9 |
| 19 | 45.6 PbO<br>49.6 TiO$_2$<br>2.8 Sm$_2$O$_3$<br>1.0 In$_2$O$_3$<br>1.0 MnO$_2$ | 48.3 | 4.9 | 9.9 |
| 20 | 45.3 PbO<br>51.0 TiO$_2$<br>2.7 Sm$_2$O$_3$<br>0.5 In$_2$O$_3$<br>0.5 MnO$_2$ | 49.7 | 3.6 | 13.8 |
| 21 | 45.2 PbO<br>51.1 TiO$_2$<br>2.7 Sm$_2$O$_3$<br>0.5 In$_2$O$_3$<br>0.5 MnO$_2$ | 47.5 | 4.8 | 9.8 |
| 22 | 47.5 PbO<br>47.8 TiO$_2$<br>2.1 Sm$_2$O$_3$<br>1.6 In$_2$O$_3$<br>1.0 MnO$_2$ | 50.0 | 2.7 | 18.5 |

The raw material thus mixed was dried, and then calcined at 850° C. for two hours. The calcined material was ground to powder with a pulverizer, and again mixed with distilled water in the pot mill. The material thus obtained was dried, and then pressed into a disc at a pressure at 350 Kg/cm$^2$. The pressed material was sintered at 1260° C. for five hours. The sintered pellet had a diameter of 16 mm and a thickness of 2 mm. The pellet was ground to a thickness of about 0.8 mm. Then, chromium and copper were deposited on opposite surfaces of the pellet by evaporation to form electrodes, and copper lead wires were bonded to the electrodes by baking silver paste between the wires and electrodes. The sample thus obtained was subjected to poling treatment in such a manner that the sample was applied with an electric field of 60 kV/cm at 150° C. while being immersed in silicone oil. For the sample thus treated, the electromechanical coupling factors $k_t$ and $k_p$ were measured. These factors $k_t$ and $k_p$ are also listed in Table 1.

Referring to Table I, samples 1 to 7 show ceramics which do not contain In$_2$O$_3$. From the results of measurements made on these ceramics, it is known that the ratio $k_t/k_p$ of the two electromechanical soupling factors exceeds 10 in a composition range where 44.7 to 46.3 mol% of PbO, 50.9 to 51.7 mol% of TiO$_2$, 1.8 to 2.6 mol% of Sm$_2$O$_3$, and 0.5 to 1.0 mol% of MnO$_2$ are contained. In particular, the ratio $k_t/k_p$ exceeds 20 in the sample 3. The samples 1 and 7 show the case where the Sm$_2$O$_3$ content is less than 1.8 mol% and the case where the Sm$_2$O$_3$ content is more than 2.6 mol%, respectively. In either case, the ratio $k_t/k_p$ is smaller than 10.

Samples 8 to 22 show ceramics containing In$_2$O$_3$. It is known from Table I that the ratio $k_t/k_p$ can be made larger in a composition range by the coexistence of Sm$_2$O$_3$ and In$_2$O$_3$. The sample 8 shows the case where the Sm$_2$O$_3$ content is less than 1.8 mol%. In this case, the ratio $k_t/k_p$ is smaller than 10 notwithstanding In$_2$O$_3$ is added. The samples 9 to 14 show the case where the $Sm_2O_3$ content is in a range from 1.8 to 2.1 mol% and the $In_2O_3$ content is in a range from 0.3 to 1.6 mol%. The ratio $k_t/k_p$ in this case is larger than that in the case where the $Sm_2O_3$ content is in the above-mentioned range but the $In_2O_3$ content is zero. The samples 15 and 16 show the case where the $In_2O_3$ content is less than 0.3 mol% and the case where the $In_2O_3$ content is more than 1.6 mol%, respectively. In either case, the addition of $In_2O_3$ is not effective. The samples 17, 18 and 20 show the case where the addition of $In_2O_3$ is effective. The sample 19 shows the case where the $Sm_2O_3$ content is more than 2.7 mol%. In this case, the ratio $k_t/k_p$ is smaller than 10. The sample 21 shows the case where the PbO content is less than 45.3 mol% and the $TiO_2$ content is more than 51.0%. In this case, the ratio $k_t/k_p$ is smaller than 10. Further, the sample 22 shows the case where the PbO content is more than 47.4 mol% and the $TiO_2$ content is less than 47.9 mol%. In this case, the addition of $In_2O_3$ is not effective.

That is, in a composition range where 45.3 to 47.4 mol% of PbO, 47.9 to 51.0 mol% of $TiO_2$, 1.8 to 2.7 mol% of $Sm_2O_3$, 0.3 to 1.6 mol% of $In_2O_3$, and 0.5 to 1.0 mol% of $MnO_2$ are contained, the addition of $In_2O_3$ is effective in enhancing the ratio $k_t/k_p$.

In the ceramics whose composition is in the above-mentioned two ranges, the $MnO_2$ content is set for a range from 0.5 to 1.0 mol%. When the $MnO_2$ content is less than 0.5 mol%, the ceramic sample may be broken by the poling treatment which is made under a high electric field to make small the electromechanical coupling factor $k_p$. Further, when the $MnO_2$ content exceeds 1.0 mol%, it is difficult to apply to the ceramic sample a high electric field for the poling treatment, since the electric resistance of the ceramic sample is decreased.

Figure 2:
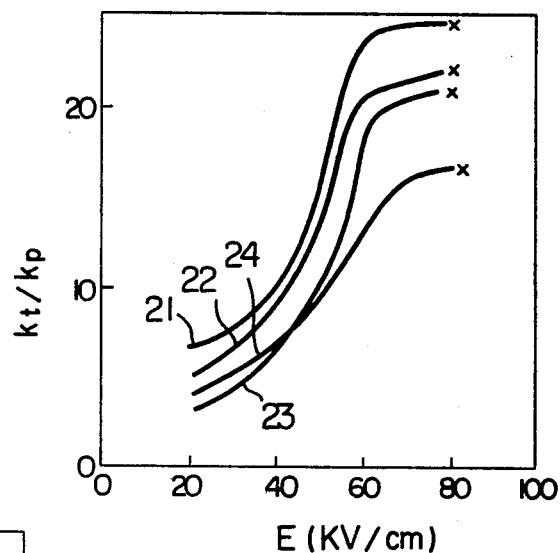
FIG. 2 is a graph showing relations between poling field E and ratio k$_t$/k$_p$.

Next, explanation will be made of the relation between poling conditions and the ratio $k_t/k_p$. FIG. 2 shows the dependence of the ratio $k_t/k_p$ on the poling field E for compositions shown in the samples 3, 6, 11 and 18, in the case where a poling temperature of 150° C. is used. When the poling field is in the range from 20 to 40 kV/cm, the ratio $k_t/k_p$ is small. However, when the poling field exceeds 40 kV/cm, the ratio $k_t/k_p$ increases abruptly. With poling fields more than 60 kV/cm, the ratio $k_t/k_p$ is greater than 10 for almost all compositions. When the poling field is further increased, the ratio $k_t/k_p$ increases until the poling field reaches 80 kV/cm. However, when the poling field exceeds 80 kV/cm, almost all of ceramic samples whose composition is in the above-mentioned composition ranges are broken.

Figure 3:
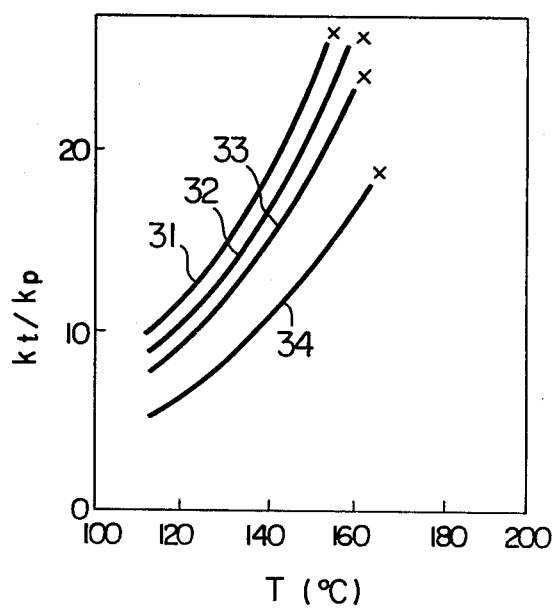
FIG. 3 is a graph showing relations between poling temperature T and ratio k$_t$/k$_p$.

FIG. 3 shows the dependence of the ratio $k_t/k_p$ on the poling temperature for the compositions shown in the samples 3, 6, 11 and 18, in the case where a poling field of 60 kV/cm is used. As is apparent from FIG. 3, when the poling temperature exceeds 130° C., the ratio $k_t/k_p$ is greater than 10 for almost all compositions. However, when the poling temperature exceeds 160° C., the electric resistance of the compositions decreases, and it is difficult to apply an electric field of 60 kV/cm or more to the compositions. Accordingly, the poling temperature is required to be in a range from 130° to 160° C.

Figure 4:
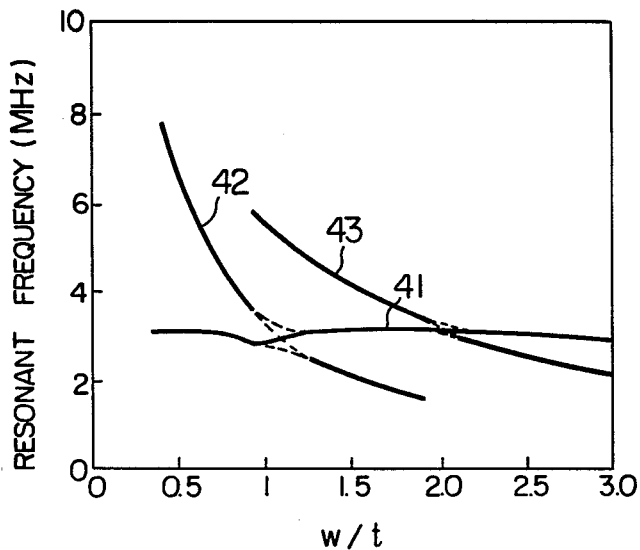
FIG. 4 is a graph showing relations between ratio w/t at individual elements included in an ultrasonic probe and resonant frequency.
Figure 5A:
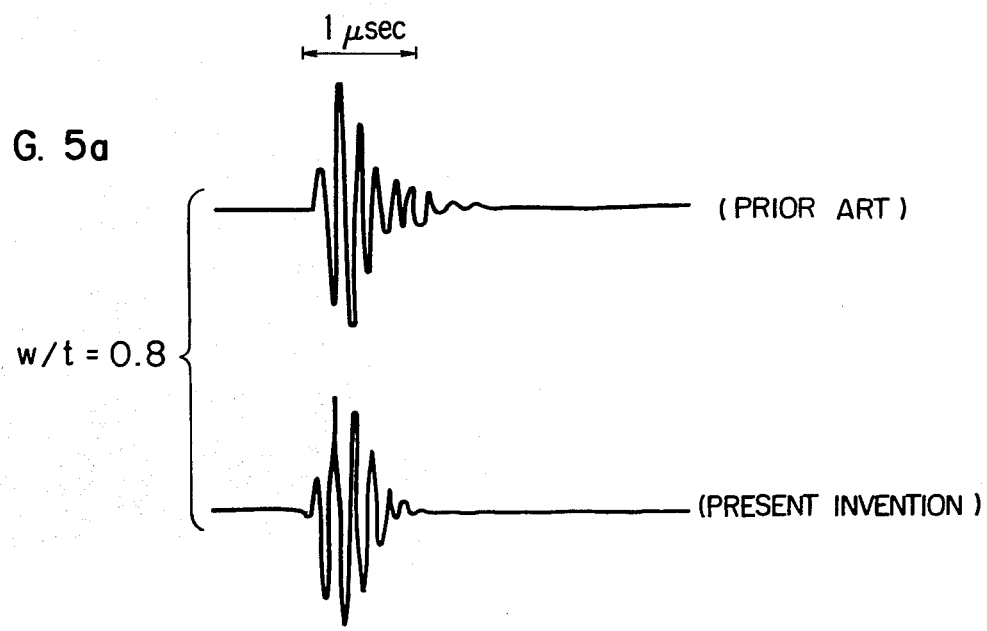
FIGS. 5a to 5e show waveforms of pulse response obtained by ultrasonic probes.
Figure 5B:
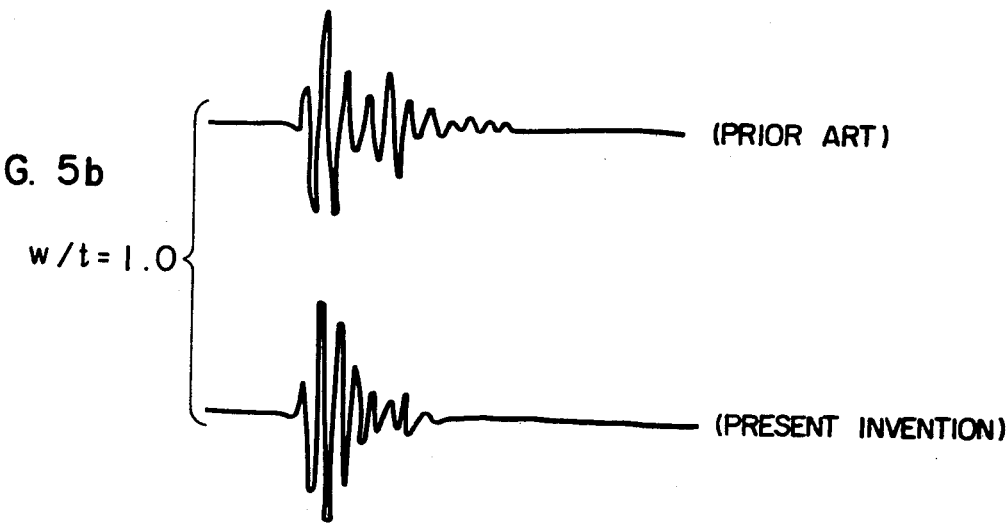
Figure 5C:
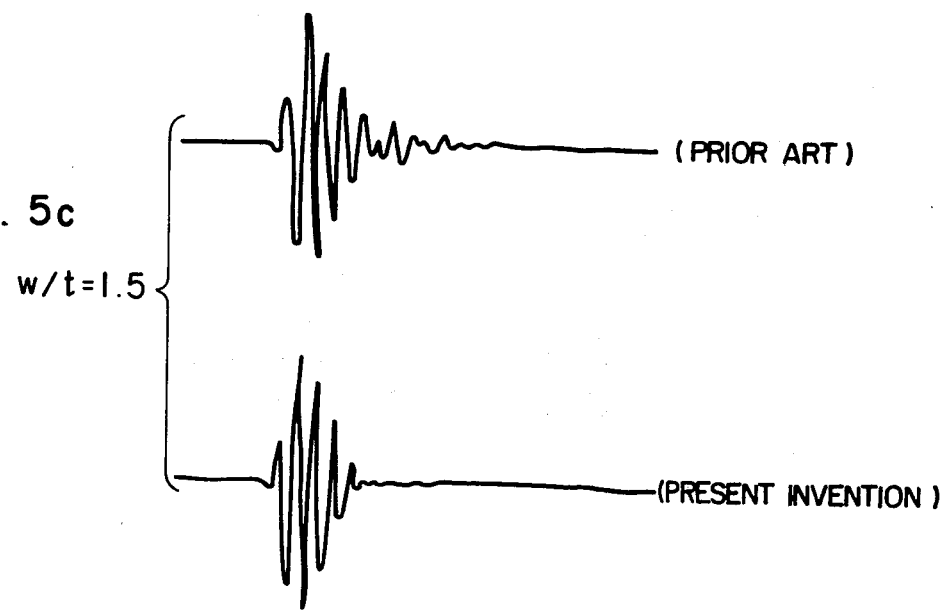
Figure 5D:
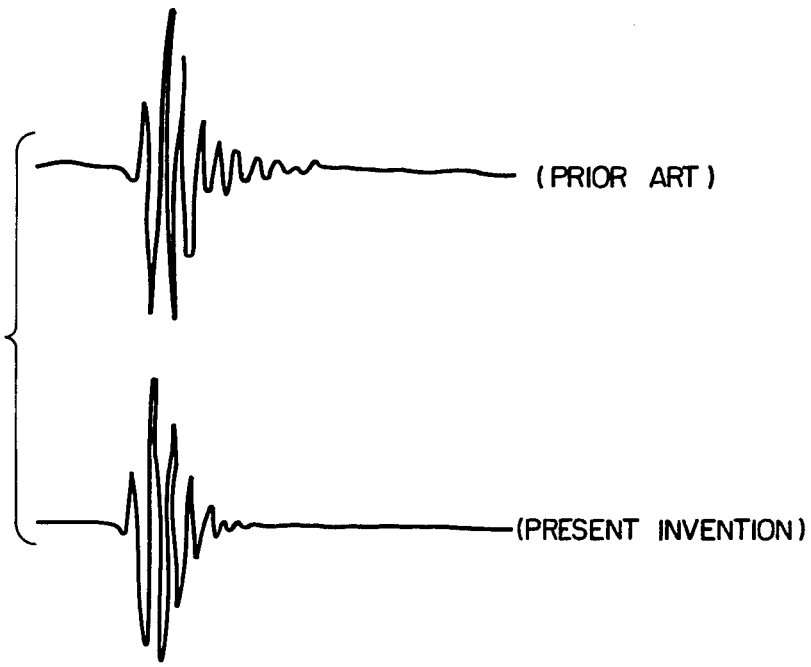
Figure 5E:
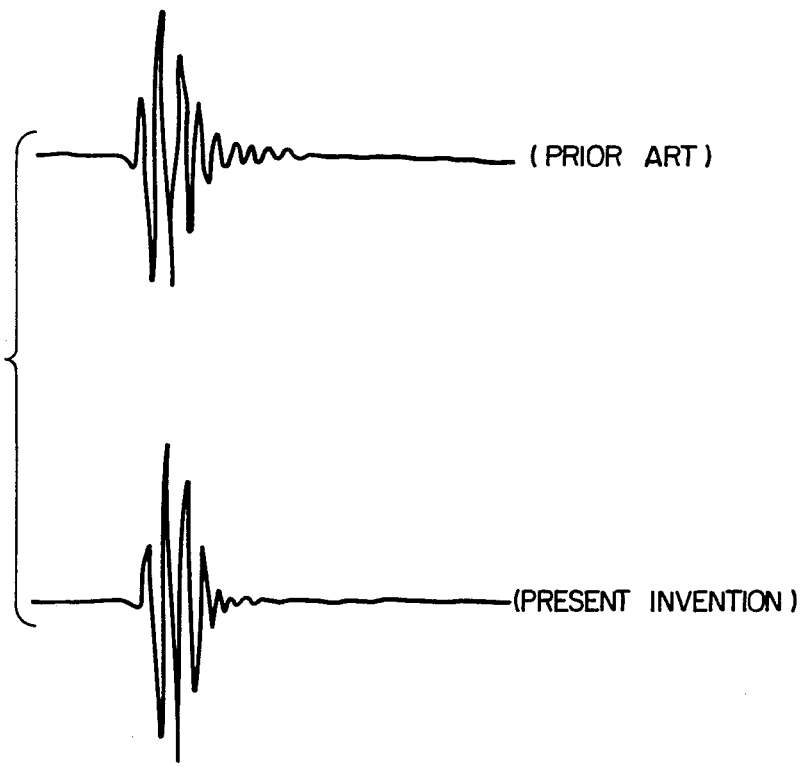

Next, each of the above-mentioned piezoelectric ceramics was used to make a number of rectangular strip resonators different in ratio of the lateral width w to the thickness t from each other but having the same thickness. The resonant frequency in the thickness dilatational vibration mode (that is, the longitudinal mode) and that in the lateral vibration mode (that is, the transverse mode) of each resonator were measured to investigate the dependence of these resonant frequencies on the ratio w/t. FIG. 4 shows the results of measurements on the sample which has the composition shown in the sample 3 and was applied with a poling field of 60 kV/cm at a poling temperature of 150° C. Referring to FIG. 4, the resonant frequency of longitudinal mode indicated by a curve 41 is kept sustantially constant independently of the ratio w/t, but slightly varies in the vicinity of w/t=1 since the coupling between the vibration in the longitudinal mode 41 and the vibration in a transverse mode 42 is strongest in the above range of w/t. Further, the resonant frequency in the longitudinal mode is affected only a little by that coupling between the vibration in the longitudinal mode 41 and the vibration in a transverse mode 43 of higher order which occurs in the vicinity of w/t=2.0. These facts show that the vibration in the longitudinal mode is far predominant over that in the transverse mode independently of the ratio w/t since the electromechanical coupling factor $k_p$ is very small. That is, a rectangular strip resonator made of the above-mentioned piezoelectric ceramic material can produce vibration substantially equal to pure thickness dilatational vibration, independently of the ratio w/t.

In fact, ultrasonic probes having such a structure as shown in FIG. 1 were fabricated using the above-mentioned piezoelectric ceramic material. FIGS. 5a to 5e show the comparison between the waveforms of pulse response obtained by the above probes and those obtained by ultrasonic probes which were fabricated using a conventional $PbTiO_3$ ceramic material (having a ratio $k_t/k_p$ nearly equal to 6). Each of the waveforms shown in FIGS. 5a to 5e was obtained in such a manner that a pulse voltage from a pulse generator including a thyristor was applied to each probe to generate an ultrasonic wave in water and an echo from a target was observed by an oscilloscope. Further, FIGS. 5a to 5e were obtained using the probes having the ratio w/t equal to 0.8, the probes having the ratio w/t equal to 1.0, the probes having the ratio w/t equal to 1.5, the probes having the ratio w/t equal to 2.0, and the probes having the ratio w/t equal to 3.0, respectively. As is apparent from FIGS. 5a to 5e, the waveforms of pulse response obtained by the probes according to the present invention are short in the signal duration time as compared with the waveforms obtained by the probes according to the prior art. Accordingly, the resolution of ultrasonic probe can be improved by the present invention. In particular in the case where the ratio w/t is equal to 1, the waveform obtained by the probe which was fabricated using the conventional $PbTiO_3$ ceramic material cannot be put to practical use while the waveform obtained by the probe according to the present invention can be used practically. These results are based upon the facts that since the piezoelectric ceramics used in an ultrasonic probe according to the present invention have a very small electromechanical coupling factor $k_p$ and are large in the ratio $k_t/k_p$, vibration substantially equal to pure thickness dilatational vibration is produced at each of resonators making up the ultrasonic probe. As mentioned above, an ultrasonic probe according to the present invention has an excellent characteristic when the ratio w/t at each resonator is in a range from 0.8 to 3.0. That is, when the ratio w/t at each resonator is smaller than 0.8, an ultrasonic probe fabricated using a conventional $PbTiO_3$ ceramic material can be employed, and therefore piezoelectric ceramics according to the present invention are not used effectively. When the ratio w/t is greater than 3.0, the width of each resonator becomes too large, and the picture quality of an ultrasonic image is deteriorated to such an extent that the image cannot be used for the practical purpose.

As has been explained in the foregoing, in the case where a ceramic material containing 44.7 to 46.3 mol% of PbO, 50.9 to 51.7 mol% of $TiO_2$, 1.8 to 2.6 mol% of $Sm_2O_3$ and 0.5 to 1.0 mol% of $MnO_2$, or a ceramic material containing 45.3 to 47.4 mol% of PbO, 47.9 to 51.0 mol% of $TiO_2$, 1.8 to 2.7 mol% of $Sm_2O_3$, 0.3 to 1.6 mol% of $In_2O_3$ and 0.5 to 1.0 mol% of $MnO_2$ is applied with an electric field of 60 to 80 kV/cm at a temperature of 130° to 160° to be subjected to poling treatment, and where the piezoelectric ceramic material thus treated is used to form an array-shaped ultrasonic probe, the ultrasonic probe has a very excellent characteristic when the ratio w/t at each of resonators making up the probe is in a range from 0.8 to 3.0.

We claim:

1. An ultrasonic probe having resonators which comprise a plurality of rectangular strips arranged to form a one-dimensional array, made of a piezoelectric ceramic material, wherein said piezoelectric ceramic material is made by subjecting a ceramic material containing 44.7 to 46.3 mol% of PbO, 50.9 to 51.7 mol% of $TiO_2$, 1.8 to 2.6 mol% of $Sm_2O_3$ and 0.5 to 1.0 mol% of MnO to poling treatment in such a manner that said ceramic material is applied with an electric field of 60 to 80 kV/cm at a temperature of 130° to 160° C. to thereby enhance the ratio $K_t/K_p$ of an electromechanical coupling factor $K_t$ of thickness dilatational vibration to an electromechanical coupling factor $K_p$ of lateral vibration to ensure high frequency operation of the probe wherein the ratio of the width w of each rectangular strip to the thickness t thereof is in a range of from 0.8 to 3.0 and wherein said poling treatment provides a ratio $K_t/K_p$ of greater than 10.

2. An ultrasonic probe having resonators which comprise a plurality of rectangular strips arranged to form a one-dimensional array, made of a piezoelectric ceramic material, wherein said piezoelectric ceramic material is made by subjecting a ceramic material containing 45.3 to 47.4 mol% of PbO, 47.9 to 51.0 mol% of $TiO_2$, 1.8 to 2.7 mol% of $Sm_2O_3$, 0.3 to 1.6 mol% of $In_2O_3$ and 0.5 to 1.0 mol% of $MnO_2$ to poling treatment in such a manner that said ceramic material is applied with an electric field of 60 to 80 kV/cm at a temperature of 130° to 160° C. to thereby enhance the ratio $K_t/K_p$ of an electromechanical coupling factor $K_t$ of thickness dilatational vibration to an electromechanical coupling factor $K_p$ of lateral vibration to ensure high frequency operation of the probe wherein the ratio of the width w of each rectangular strip to the thickness t thereof is in a range of from 0.8 to 3.0 and wherein said poling treatment provides a ratio $K_t/K_p$ of greater than 10.

3. An ultrasonic probe according to claim 1 or 2, further including a backing member for supporting said resonators, electrodes on two opposing surfaces of said rectangular strips, and a common electrode for said strips.

* * * * *